United States Patent
Ishiguro et al.

(10) Patent No.: US 9,799,847 B2
(45) Date of Patent: Oct. 24, 2017

(54) FLEXIBLE ORGANIC EL DEVICE

(71) Applicant: Futaba Corporation, Mobara-shi, Chiba (JP)

(72) Inventors: Shigeyuki Ishiguro, Kitaibaraki (JP); Shigeo Naritomi, Kitaibaraki (JP); Ikuo Ohmori, Kitaibaraki (JP); Mitsufumi Kodama, Mobara (JP); Fumio Kimura, Kitaibaraki (JP)

(73) Assignee: Futaba Corporation, Chiba (JP)

( * ) Notice: Subject to any disclaimer, the term of this patent is extended or adjusted under 35 U.S.C. 154(b) by 0 days.

(21) Appl. No.: 15/171,943

(22) Filed: Jun. 2, 2016

(65) Prior Publication Data

US 2016/0359138 A1 Dec. 8, 2016

(30) Foreign Application Priority Data

Jun. 5, 2015 (JP) .................. 2015-114661

(51) Int. Cl.
*H01L 51/52* (2006.01)
*H01L 27/32* (2006.01)

(52) U.S. Cl.
CPC ...... *H01L 51/5253* (2013.01); *H01L 27/3281* (2013.01); *H01L 2251/5338* (2013.01); *H01L 2251/55* (2013.01); *H01L 2251/558* (2013.01)

(58) Field of Classification Search
CPC ............. H01L 51/5253; H01L 51/5237; H01L 2251/5338; H01L 2251/558; H01L 51/56; H01L 51/0097; H01L 51/5234; H01L 2251/55; H01L 27/3281
See application file for complete search history.

(56) References Cited

U.S. PATENT DOCUMENTS

| | | | | |
|---|---|---|---|---|
| 2003/0189403 A1* | 10/2003 | Yamada | ................ | C23C 16/403 313/511 |
| 2012/0207991 A1* | 8/2012 | Arai | ....................... | B32B 15/08 428/216 |
| 2013/0121426 A1 | 5/2013 | Drumeller | | |
| 2013/0214266 A1* | 8/2013 | Hirase | .................... | H05B 33/04 257/40 |
| 2014/0306211 A1* | 10/2014 | Okuyama | ........... | H01L 51/5253 257/40 |
| 2014/0367644 A1 | 12/2014 | Song et al. | | |

FOREIGN PATENT DOCUMENTS

| CN | 1638539 | 7/2005 |
|---|---|---|
| CN | 102016962 | 4/2011 |

(Continued)

OTHER PUBLICATIONS

Office Action issued in counterpart Japanese Application No. 2015-114661, dated Aug. 1, 2017, 3 pages.

(Continued)

*Primary Examiner* — Roy Potter
(74) *Attorney, Agent, or Firm* — Hamre, Schumann, Mueller & Larson, P.C.

(57) ABSTRACT

The present invention relates to a flexible organic EL device comprising, on one of the surfaces of an organic resin base, an inorganic protective layer, an organic EL light emitting part, a buffer layer, and a breakage-resistant layer in this order, wherein the buffer layer is a silicone or EPDM containing layer and an elastic modulus of the breakage-resistant layer at 5 to 35° C. is 100 MPa to 300 GPa.

7 Claims, 1 Drawing Sheet

(56) References Cited

FOREIGN PATENT DOCUMENTS

| | | |
|---|---|---|
| JP | 2001-002865 | 1/2001 |
| JP | 2004-103471 | 4/2004 |
| JP | 2010-528407 | 8/2010 |
| JP | 2011-003522 | 1/2011 |
| JP | 2014-197522 | 10/2014 |
| JP | 2014-199768 | 10/2014 |
| TW | 201448314 | 12/2014 |

OTHER PUBLICATIONS

Office Action issued in counterpart Taiwanese Application No. 105115604, dated Jul. 11, 2017, 5 pages.

* cited by examiner

FLEXIBLE ORGANIC EL DEVICE

TECHNICAL FIELD

The present invention relates to a flexible organic EL device.

BACKGROUND

A wide variety of flexible organic EL devices using a flexible film as a base have been developed (e.g., see Patent Literature 1). When a flexible organic EL device is used, it is most often laminated against other devices such as clear cases and touch panels having a curved-surface shape taking advantage of the flexibility and thinness thereof.

Patent Literature 1: Japanese Unexamined Patent Publication No. 2004-103471

SUMMARY

Incidentally, the flexible organic EL device as described above is mainly composed of a resin material and thus susceptible to external impacts caused by a hard pointy tip of a tool and the like, or a foreign object pressed thereagainst. Further, an inorganic protective film is sometimes formed by using ceramics and the like inside a device because such a film can enhance the protective function while being transparent, but the inorganic protective film may be cracked depending on the level of impact, which results in that the function thereof may be lost.

In addition, during the lamination as described above, a pressure is sometimes applied with a hard foreign object and the like being caught between a flexible organic EL device and a case or a touch panel, or from the beginning, a foreign object is sometimes adhered to a rubber roller itself used when applying such a pressure. Thus, the case that the device is damaged by such a foreign object or the like as a starting point has become a problem. As described so far, the flexible organic EL device is not necessarily having good performance against impacts, and for this reason the production yield is notably poor at present.

Accordingly, in view of the above circumstances, the present invention has an object to provide a flexible organic EL device with good impact resistance and capable of achieving a good production yield.

The present invention provides a flexible organic EL device comprising, on one of the surfaces of an inorganic resin base, an organic protective layer, an organic EL light emitting part, a buffer layer, and a breakage-resistant layer in this order, wherein the buffer layer is a silicone- or EPDM- (ethylene-propylene-nonconjugated polyene copolymer rubber) containing layer and an elastic modulus of the breakage-resistant layer at 5 to 35° C. is 100 MPa to 300 GPa. The present invention has good impact resistance against external impacts and is thus capable of achieving a good production yield.

In the present invention, it is preferable that another buffer layer be provided on the other surface of the organic resin base and the another buffer layer be a silicone- or EPDM-containing layer. Such a layer can further improve impact resistance.

In the present invention, it is preferable that an elastic modulus of the buffer layer at 5 to 35° C. be 1 kPa to 10 MPa.

In the present invention, it is preferable, in view of improving impact resistance, that a thickness of the buffer layer be 25 to 500 μm, and it is preferable that a thickness of the breakage-resistant layer be 10 to 500 μm.

Note that, in the present invention, it is preferable that the another buffer layer have stickiness. Due to this property, the flexible organic EL device can be laminated to a product case without using an adhesive separately.

In the present invention, it is preferable, in view of improving a sealing effect on the organic EL light emitting part, that the organic EL light emitting part be sealed using a sealant.

According to the present invention, a flexible organic EL device having good impact resistance and capable of achieving a good production yield can be provided.

BRIEF DESCRIPTION OF THE DRAWINGS

FIG. 1 is a cross-sectional view illustrating the flexible organic EL device according to the present embodiment.

DETAILED DESCRIPTION

<Flexible Organic EL Device>

Figure 1:
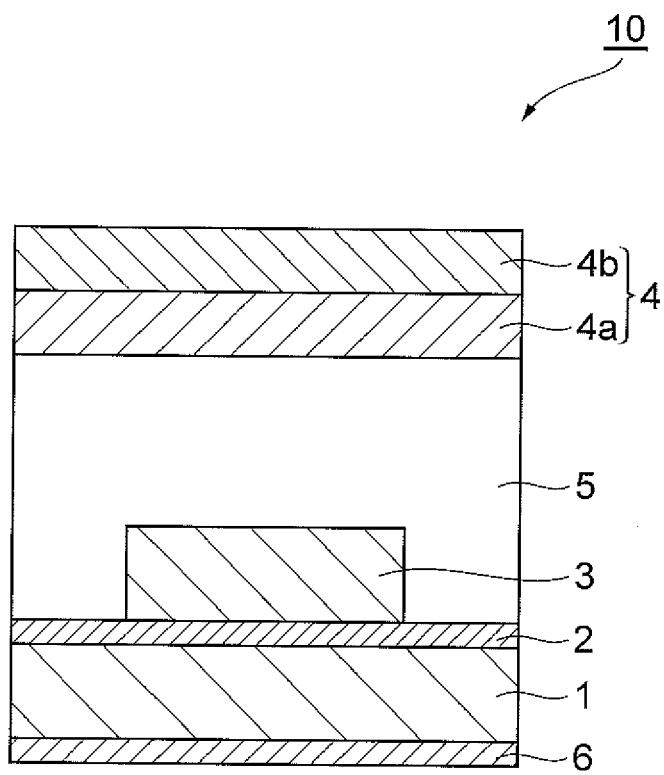
FIG. 1.

An embodiment of the present invention will be described with reference to FIG. 1. FIG. 1 is a cross-sectional view of the flexible organic EL device (hereinafter, simply referred to as "organic EL device") 10 according to the present embodiment.

The organic EL device 10 comprises, on one of the surfaces of an organic resin base 1, an inorganic protective layer 2, an organic EL light emitting part 3, and a sealing layer 4 in this order, wherein the sealing layer 4 comprises a buffer layer 4a and a breakage-resistant layer 4b. Note that the organic EL light emitting part 3 may be sealed using a sealant 5. Moreover, the organic EL device 10 may further comprise, on the other surface of the organic resin base 1, another buffer layer 6. Each of the configuration of the organic EL device according to the present embodiment is described one by one below.

[Organic Resin Base]

The organic resin base 1 can be suitably selected from various resin bases in accordance with the purpose of use. Thus, the resin base is not particularly limited, and specific examples of the resin constituting the resin base include fluorine resins, polyethylene, polypropylene, polyvinyl chloride, polyvinyl fluoride, polystyrene, ABS resin, polyamide, polyacetal, polyester, polycarbonate, modified polyphenylene ether, polysulfone, polyarylate, polyetherimide, polyamideimide, polyimide, polyphenylene sulphide, liquid crystalline polyester, polyethylene terephthalate, polybutylene terephthalate, polyethylene naphthalate, polyoxymethylene, polyether sulfone, polyether ether ketone, polyacrylate, acrylonitrile-styrene resins, phenol resins, urea resins, melamine resins, unsaturated polyester resins, epoxy resins, polyurethane, silicone resins, and amorphous polyolefin. These resins may be used singly, or two or more thereof may be used in combination.

It is preferable in view of compatibility between the strength and easy bendability that the thickness of the organic resin base be 5 to 250 μm.

[Inorganic Protective Layer]

As the inorganic protective layer 2, a layer of an inorganic substance such as an inorganic oxide formed by a chemical vapor deposition method, an atomic layer deposition method, or a sputtering method, can be used. Such an inorganic substance can be used without particular limitation as long as it can block moisture, and examples include silicon oxide, aluminium oxide, silicon oxynitride, and silicon nitride. These inorganic substances may be used singly, or two or more thereof may be used in combination. Note that, as the inorganic protective layer 2, a layer obtained by curing a glass coating agent such as a polysilazane solution after coating may also be laminated.

It is preferable in view of blocking performance of water vapor that the thickness of the inorganic protective layer 2 be 0.5 to 10 μm.

[Organic EL Light Emitting Part]

The organic EL light emitting part 3 is not particularly limited, and a common light emitting part can be used. Specifically, a light emitting part comprising an electrode, a predetermined insulating film (including a cathode separator) formed on the electrode, an organic EL layer, and the like, can be used. Note that the organic EL light emitting part 3 comprising each of the components will be also described later in the section of a method for producing the flexible organic EL device.

Note that the organic EL light emitting part 3 may have a moisture collecting material (not shown) formed on the surface thereof.

The moisture collecting material is not particularly limited as long as it is a solid material which chemically reacts with water and does not generate any by-product, or generate a by-product, if any, which does not affect the functions of the organic EL light emitting part. Examples of the moisture collecting material include oxides of an alkali metal and/or alkaline earth metal.

[Sealing Layer]

The sealing layer 4 comprises the buffer layer 4a and the breakage-resistant layer 4b. In the present embodiment, the organic EL device is protected from external forces and impacts by at least two-layer structure comprising a silicone- or EPDM-containing layer (buffer layer 4a) and a layer harder than the former layer (breakage-resistant layer 4b). Generally, it is fingernails of a worker and tools such as tweezers that tend to cause the problem during the step of mounting the organic EL device created on the organic resin base in a final product or a semi-finished product. More specifically, the sealing layer 4 of the present embodiment can protect the organic EL device from external forces possibly caused by fingernails and tools even when a worker with normal attentiveness performs work at the time of producing a final product, or the like.

The buffer layer 4a is a silicone- or EPDM-containing layer and, as its name suggests, it mainly has functions to buffer external impacts. With the provision of the buffer layer 4a, direct damages to a thin film part of the organic EL light emitting part 3 caused by impacts from external forces can be avoided and consequently the peeling of the thin film and short leakage between the anode and cathode can be prevented from occurring. The composition of the material for forming the buffer layer 4a is not particularly limited as long as the layer has a sufficient necessary softness, and commercially available sheet-like silicone elastomers and EPDM with an adjusted composition for achieving an ultralow hardness (e.g., the ultralow hardness rubber composition described in Japanese Unexamined Patent Publication No. 2001-2865) may be used. The silicone layer is formed by using a one-component or two-component curable liquid silicone capable of undergoing an addition reaction or a condensation reaction with the use of a catalyst at about room temperature. Note that the material for forming the buffer layer 4a must have, in addition to the property of softness, the properties generally required of the materials for electronic components such as chemical stabilities which include, for example, not generating a low molecular weight siloxane or not causing the separation of raw materials.

The buffer layer 4a may contain silica fine powder or the like having an average particle size of 1 μm or less as a filler within the range in which the function of the buffer layer is not deteriorated.

The breakage-resistant layer 4b mainly has the function for receiving an external force applied to an extremely small area such as a point impact caused by, for example, the tip of tweezers and dispersing the impact to a larger area. When receiving an external force, the breakage-resistant layer 4b itself may suffer from damages such as plastic deformation as long as it does not cause plastic deformation to the buffer layer 4a. In other words, incidence of some surface scratches and deformations may not be major problems and hence various materials can be selected. Examples of the material for forming the breakage-resistant layer 4b include organic materials such as the resins described as the examples in the section of the organic resin base above and inorganic materials (including metal materials) such as metal foils/sheets of stainless steel foils, copper foils, and aluminum foils, and sheet glasses.

For the proper protection of the organic EL device 10, it is essential that the breakage-resistant layer 4b have the strength which does not cause plastic deformation (the strength which only causes elastic deformation) to the buffer layer 4a in the lower layer thereof when the external force as described above is applied to the breakage-resistant layer 4b. In view of this, the elastic modulus of the breakage-resistant layer 4b at a work environment temperature of 5 to 35° C. is 100 MPa to 300 GPa. On the other hand, in view of imparting sufficient buffering function to the sealing layer 4, it is preferable for the buffer layer 4a to have an elastic modulus of 1 kPa to 10 MPa, more preferably 10 kPa to 5 MPa, at a work environment temperature of 5 to 35° C. Note that, in the present embodiment, the elastic modulus of the buffer layer 4a can be defined as the value measured in accordance with JIS K 6254: 2003. Similarly, the elastic modulus of the breakage-resistant layer 4b can be defined as the value measured in accordance with JIS K 7171: 2008 in the case where an organic material (such as plastic) is used and in accordance with JIS Z 2280: 1993 in the case where a metal material is used. Note that, in view of improving the protective function, the larger the modulus ratio of the buffer layer 4a to the breakage-resistant layer 4b (an elastic modulus of the breakage-resistant layer 4b/an elastic modulus of the buffer layer 4a), more preferable. More specifically, it is preferable that the elastic modulus of the breakage-resistant layer 4b be two digits greater than the elastic modulus of the buffer layer 4a, and it is more preferable to be three digits greater.

The thickness of the buffer layer 4a is not generally defined in consideration of the material and thickness of the breakage-resistant layer 4b, however, in view of imparting sufficient buffering function to the sealing layer 4 and maintaining the overall thickness of the organic EL device 10 thin, it is preferable to be 25 to 500 μm, and it is more preferable to be 50 to 250 μm. The thickness of the breakage-resistant layer 4b is also not generally defined in consideration of the material used, however, in view of imparting sufficient protective function to the sealing layer 4, it is preferably 10 to 500 μm, and more preferably 25 to 250 μm. Note that when a comparatively soft resin plastic material which is however harder than the buffer layer 4a is used as the breakage-resistant layer 4b, the breakage-resistant layer 4b with a certain thickness can protect the organic EL device 10 whereby the object thereof is achieved. More specifically, when, for example, a PET film or a polycarbonate film, which have been used in a variety of purposes, is used as the breakage-resistant layer 4b, the thickness is preferably 50 μm or more, and more preferably 100 μm or more in practice, in view of exhibiting sufficient protective function. Further, when, for example, a stainless steel foil is used as the breakage-resistant layer 4b, the thickness is preferably 10 μm or more, and more preferably 25 μm or more, in the same view as above. Note that when a thickness of the latter is 25 to 50 μm in practice, an extremely good protective function can be exhibited.

In view of easily obtaining the sealing effect and the buffering effect, the sealing layer 4 may comprise a plurality of the buffer layers 4a and a plurality of the breakage-resistant layer 4b, respectively. In other words, the sealing layer 4 may have the configuration comprising, from the organic EL light emitting part 3 side, the first buffer layer, the first breakage-resistant layer, the second buffer layer, and the second breakage-resistant layer in this order.

Note that it is preferable for the sealing layer 4 to have an overall thickness of about 50 to 500 μm, in view of achieving the sufficient function as the sealing layer while maintaining a suitable thinness as the device.

[Sealant]

In the present embodiment, the organic EL light emitting part 3 may be sealed using a sealant 5. Examples of the raw material for forming the sealant 5 include those containing thermoplastic acrylic resins, heat curable epoxy resins, rubber modified epoxy resins, two-component curable urethane resins, polysilazane (perhydropolysilazane) or polysiloxane as the main component. Of these, those containing polysilazane (perhydropolysilazane) or polysiloxane as the main component are preferably used in view of blocking water vapor. Using such a sealant, the organic EL light emitting part 3 is sealed by a glass coating agent.

Examples of the effects brought by providing the sealant 5 include as follows. Specifically, the organic EL light emitting part 3 in the present embodiment can be constituted in which the entire part (cathode material, insulating film material, and the like) is coated with an inorganic protective film formed by a vacuum film deposition such as a plasma CVD method or a sputtering method. Despite the protective film itself being high in moistureproofness and gas barrier property, it is extremely difficult to form a fault free (a state of being free from a pin hall caused by dusts inevitable from a film deposition method, and the like) inorganic protective film. Such a defective part of the inorganic protective film can be effectively covered by a moistureproof film provided by a film deposition method with different techniques. Note that when the sealant 5 is formed using the raw materials described above, a coating using a liquid is available and thus the organic EL light emitting part 3 can be evenly coated following the complex surface shape thereof. By such a coating, the mechanical strength as the device can be improved.

Note that when the organic EL light emitting part 3 is not sealed by the sealant 5, an adhesion part (not shown), for example, may separately be provided using a suitable adhesive to ensure the airtightness around the organic EL light emitting part 3. More specifically, the adhesion part is formed between the organic resin base 1 (more strictly, the inorganic protective layer 2) and the sealing layer 4 so as to surround the organic EL light emitting part 3. The organic resin base 1 and the sealing layer 4 are adhered by this adhesion part, whereby the airtightness around the organic EL light emitting part 3 is ensured by these organic resin base 1, the sealing layer 4, and the adhesion part.

The adhesion part is not particularly limited and can be formed by curing an epoxy adhesive, an acrylic adhesive, or an olefin adhesive. Note that, in view of preventing water vapor from entering, the thickness is preferably 20 μm or less, and more preferably 10 μm or less. Further, in view of ensuring sufficient adhesive strength and elasticity, such a thickness is preferably 1 μm or more, and more preferably 2 μm or more.

[Other Buffer Layers]

The organic EL device 10 of the present embodiment may further comprise another buffer layer 6 on the other surface of the organic resin base 1. The another buffer layer 6 is a silicone- or EPDM-containing layer and can be formed using the same materials as in the above buffer layer 4a but the configuration of both layers does not have to be the same. The another buffer layer 6 not only plays a role of protecting the organic resin base 1 as in the buffer layer 4a but also serves to fix the organic EL device 10 to a product case. For this reason, in the present embodiment, it is preferable that the another buffer layer 6 have stickiness. In view of this, for the another buffer layer 6, for example, silicone buffer layers containing a silicone resin as a stickiness-imparting component can be particularly preferably used among the silicones described as the examples for the buffer layer 4a above. Note that the another buffer layer 6 may be provided singly, or a plurality of buffer layers may be provided through base films such as a PET film, or the like. Examples of the latter embodiment include silicone double-sided tapes (a PET film on both surfaces of which an adhesive silicone resin layer is formed).

During the lamination work of the organic EL device 10 onto a product case, the work is practiced under an environment with a higher cleanliness level than the usual environment so as not to catch a foreign object, but when compared with the step of producing the organic EL device 10 itself, problems caused by foreign objects occur at a relatively higher frequency. When a foreign object caught is hard, the organic EL device 10 may be damaged: for example, the inorganic protective layer 2 may be broken or the organic EL light emitting part 3 itself may be damaged. However, when the organic EL device 10 comprises the another buffer layer 6 having stickiness in advance, an incidence of such a problem caused by foreign objects can be reduced.

Further, when a product case shape has a curved surface, the organic EL device 10 is likely to be out of position when laminated thereon or air in the form of foam may easily be caught whereby the difficulty of work is increased. However, when the another sticky buffer layer 6 particularly having stickiness is provided, re-lamination work can be carried out by easily peeling the layer and re-laminating it. This significantly contributes a yield increase and is consequently effective to reduce the cost. This is much more effective in the case where a touch panel is already laminated to a product case because touch panels are expensive.

It is preferable that the thickness of the another buffer layer 6 be 50 to 500 μm in view of exhibiting sufficient buffering function and maintaining the overall thickness of organic EL device 10 thin.

<Method for Producing Flexible Organic EL Device>

The flexible organic EL device of the present embodiment can be produced by a common method without particular limitation. Hereinafter, an embodiment of the preferable production method will be briefly described with reference to FIG. 1.

First, an organic resin base 1 is temporarily fixed on a glass substrate. For the temporary fixation, a silicone- or EPDM-containing layer to be the another buffer layer 6 described above may be used. When the another buffer layer 6 is left unpeeled after completing the thin film steps, it can be directly reused for the lamination to a product case.

Next, a flattening layer is applied to and cured on the organic resin base 1 to subsequently deposit the inorganic protective layer 2 (passivation film). Then, a transparent electrode (anode) film is deposited by sputtering on the inorganic protective layer 2. Note that, examples of the anode material include indium tin oxide (ITO), indium oxide, indium zinc oxide (IZO), zinc oxide, tin oxide, gold, and polyaniline, and these may be used singly or in combinations of two or more.

Next, the transparent electrode (anode) film is patterned by photolithography and subsequently a wiring electrode film is deposited by sputtering. Examples of the wiring electrode film include Cr (chromium), MoNb (molybdenum niobium) alloy, and a laminated film of Mo alloy/Al alloy/Mo alloy.

Subsequently, the wiring electrode film is further patterned and an insulating film (an interlayer insulating film and a cathode separator) is formed by photolithography. Suitable materials for the insulating film are photosensitive materials such as photosensitive polyimide resins, novolak photoresists, photosensitive acrylic reins, and photosensitive cycloolefin resins. However, nonphotosensitive polyimide reins, silicon oxide, silicon oxynitride, or silicon nitride, after deposition, may be pattern processed using a photoresist to be the insulating film.

Next, organic EL materials, cathode, and in some cases the inorganic protective film are deposited in this order by the vacuum deposition method whereby the organic EL light emitting part 3 is formed on the organic resin base 1. Commonly used low molecular organic light emitters (organic fluorescent light emitters) may be used to be the organic EL material. Specific examples of the low molecular organic light emitter include pyrene, anthracene, naphthacene, phenanthrene, coronene, chrysene, fluorene, perylene, perinone, diphenyl butadiene, coumarin, styryl, pyrazine, aminoquinoline, imine, diphenylethylene, merocyanine, quinacridone, rubrene, and derivatives thereof. Alternatively, a high molecular organic light emitter can also be used to be the organic EL material. Examples of the high molecular organic light emitter include at least one selected from polyparaphenylene vinylene derivatives, polythiophene derivatives, polyparaphenylene derivatives, polysilane derivatives, polyacethylene derivatives, polyfluorene derivatives, polyvinylcarbazole derivatives, pigment organic light emitters, and polymerized metal complex organic light emitters. Examples of the cathode (electron injection electrode) material include metals with a low work function such as Mg, Ca, Ba, Sr, Li, Yb, Eu, Y, and Sc, magnesium alloys (MgAg, etc.) which are alloys of these metals and other metals, aluminum alloys (AlLi, AlCa, AlMg, etc.), alkali metal oxides ($Li_2O$, etc.), alkali metal fluorides (LiF, etc.), and BaO, SrO, and CaO all of which are oxides of alkaline earth metals. These materials may be used singly, or two or more thereof may be used in combination. Further, aluminium (Al) may further be laminated thereon. The inorganic protective film can be formed using the same materials described in the above inorganic protective layer 2. Note that the moisture collecting material described above may be formed on the surface of the organic EL light emitting part 3. The moisture collecting material functions to remove a very small amount of moisture contained in the insulating film (interlayer insulating film and cathode separator).

After sealing the organic EL light emitting part 3 using the sealant 5 in some cases, the sealing layer 4 comprising the buffer layer 4a and the breakage-resistant layer 4b is further formed.

Then, the organic resin base 1 is peeled from the glass substrate, and a number of elements formed on the organic resin base 1 are cut into pieces (panels) with an organic resin base 1. Note that, in some cases, immediately after the above peeling, the another buffer layer 6 is formed on the surface opposite to the surface of the organic resin base 1 on which the organic EL light emitting part 3 is provided.

To the thus obtained piece, an IC and a flexible printed circuit board are implemented and a protective resin for implementation is applied so as to seal the IC whereby the organic EL device 10 is obtained.

Examples of such an organic EL device 10 include a film passive matrix organic EL display (film PMOLED).

The embodiments according to the present invention have been described so far with reference to the figure but the specific configuration are not limited to these embodiments, and design modifications and the like are also encompassed within the range without departing from the aspect of the present invention.

EXAMPLE

Hereinafter, the present invention will be described in detail with reference to Examples, but is not limited to the following description.

Example 1

The present Example illustrates a case where a film passive matrix organic EL display (film PMOLED) was created as the organic EL device.

First, a PET film (organic resin base 1: base PET film) to be the base for forming the organic EL light emitting part 3 was temporarily fixed on a glass substrate using a double-sided tape. An acrylic resin was applied to and cured on the film surface and subsequently a silicon oxynitride film was deposited thereon by the plasma CVD method as the inorganic protective layer 2. The thicknesses of the PET film and the silicon oxynitride film was 125 μm and 1.5 μm, respectively.

Next, ITO (indium tin oxide) as the anode material was deposited by sputtering and subsequently a cathode pattern was formed using photolithography. Then, a laminated film of Mo (molybdenum) alloy/Al (aluminium) alloy/Mo alloy (hereinafter described as the MAM wiring film) as the metal for wiring electrodes was continuously deposited by sputtering while the vacuum condition was maintained, and a wiring pattern for connecting the anode and a driver IC was further formed by photolithography. Note that a series of these processing methods are those commonly used for organic EL displays and liquid crystal displays and thus not described herein in detail.

Next, pattern level differences of the ITO anode and parts of the MAM wiring film which do not want to be exposed were coated with an insulating film consisting of a novolak photosensitive resin. Further on the insulating film, a structure with a substantially trapezoid cross-section (upper base>lower base) was formed using a negaresist. The obtained structure is an element separating structure (cathode separator) which serves to separate the cathode electrode of adjacent elements in the passive matrix organic EL display.

After sufficiently drying the base PET film on which the components up to the cathode separator had already been formed, α-NPD, a phenyl anthracene derivative, an aluminium quinolinol complex, several other organic EL materials, and an Mg/Ag alloy as the electron injection electrode were continuously deposited by a vacuum deposition method. Further, a silicon nitride film was continuously deposited by the plasma CVD method as the inorganic protective film while the vacuum condition was maintained. The inorganic protective film was deposited at other areas than the wiring part connecting to the IC and FPC. Thus, the organic EL light emitting part 3 was formed.

After depositing the inorganic protective film, the sealing was carried out using a room temperature curable inorganic glass coating agent (glass coating agent) to be the sealant 5 such that the organic EL light emitting part 3 was sealed.

Subsequently, the sealing layer 4 (sealing film), in which a sticky silicone resin as the buffer layer 4a was applied to one surface of the PET film as the breakage-resistant layer 4b, was laminated onto the glass coating described above such that the silicone resin surface faced the glass coating side. The thickness of the buffer layer 4a and the breakage-resistant layer 4b were 100 μm and 250 μm, respectively. Further, the elastic modulus at 25° C. were about 200 kPa and about 2 GPa, respectively.

Then, the base PET film was peeled from the glass substrate, cut into PMOLED pieces, and an IC and a flexible printed circuit board were implemented thereon, whereby a PMOLED panel was completed.

The PMOLED panel according to the present example has the sealing layer comprising the buffer layer and breakage-resistant layer as described above and thus the forces applied by contacting a hard foreign object or a tool were dispersed and relieved. For this reason, the yield during the laminating step of the panel onto a case was improved and the production cost was effectively reduced.

Example 2

First, the steps up to the step in which the sealing layer 4 was laminated onto the glass coating were carried out in the same manner as in Example 1. Thereafter, in the present example, immediately after peeling the base PET film from the glass substrate, a double-sided tape (silicone double-sided tape), in which a sticky silicone resin as the another buffer layer 6 was applied to both surfaces of the PET film, was laminated onto the side of the base PET film on which the organic EL light emitting part 3 was not formed. Thereafter, a PMOLED panel was completed in the same manner as in Example 1. The thickness of the another buffer layer 6 alone was 100 μm.

The PMOLED panel of the present example was easily laminated to a product case without suffering from any damages, in addition to the effects of the above Example 1. Further, the panel was easily peelable and relaminatable even after once laminated, and therefore, it was effective to correct the out-of-position incidence during the lamination work in the production step.

The present organic EL device has flexibility because an organic resin base is used. As a result, the device is applicable to high quality design electronic devices, and the like, having a display part with a curved surface.

REFERENCE SIGNS LIST

1 . . . Organic resin base, 2 . . . Inorganic protective layer, 3 . . . Organic EL light emitting part, 4 . . . Sealing layer, 4a . . . Buffer layer, 4b . . . Breakage-resistant layer, 5 . . . Sealant, 6 . . . Another buffer layer, 10 . . . Organic EL device

What is claimed is:
1. A flexible organic EL device comprising, on one of surfaces of an organic resin base:
an inorganic protective layer;
an organic EL light emitting part;
a buffer layer; and
a breakage-resistant layer
in this order,
wherein
the buffer layer is a silicone- or EPDM-containing layer, and
an elastic modulus of the breakage-resistant layer at 5 to 35° C. is 100 MPa to 300 GPa.
2. The flexible organic EL device according to claim 1, wherein the organic resin base further comprises another buffer layer on the other surface, and the another buffer layer is a silicone- or EPDM-containing layer.
3. The flexible organic EL device according to claim 1, wherein an elastic modulus of the buffer layer at 5 to 35° C. is 1 kPa to 10 MPa.
4. The flexible organic EL device according to claim 1, wherein a thickness of the buffer layer is 25 to 500 μm.
5. The flexible organic EL device according to claim 1, wherein a thickness of the breakage-resistant layer is 10 to 500 μm.
6. The flexible organic EL device according to claim 2, wherein the another buffer layer has stickiness.
7. The flexible organic EL device according to claim 1, wherein the organic EL light emitting part is sealed with a sealant.

* * * * *